US008039297B2

(12) United States Patent
Kim et al.

(10) Patent No.: US 8,039,297 B2
(45) Date of Patent: Oct. 18, 2011

(54) PLASMA TREATING METHODS OF FABRICATING PHASE CHANGE MEMORY DEVICES, AND MEMORY DEVICES SO FABRICATED

(75) Inventors: Young-Kuk Kim, Seoul (KR); Mi-Lim Park, Gyeonggi-do (KR); Dong-Ho Ahn, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 217 days.

(21) Appl. No.: 12/487,292

(22) Filed: Jun. 18, 2009

(65) Prior Publication Data

US 2010/0051893 A1    Mar. 4, 2010

(30) Foreign Application Priority Data

Aug. 29, 2008 (KR) .................. 10-2008-0085402

(51) Int. Cl.
*H01L 21/06* (2006.01)
*H01L 21/00* (2006.01)
(52) U.S. Cl. .......................... 438/102; 438/95
(58) Field of Classification Search ............ 438/95, 438/102
See application file for complete search history.

(56) References Cited

U.S. PATENT DOCUMENTS

| 6,867,064 | B2 | | 3/2005 | Campbell et al. |
| 7,838,329 | B2 | * | 11/2010 | Hunks et al. ............ 438/102 |
| 2003/0045049 | A1 | | 3/2003 | Campbell et al. |
| 2006/0138393 | A1 | * | 6/2006 | Seo et al. ............ 257/2 |
| 2006/0141710 | A1 | | 6/2006 | Yoon et al. |
| 2006/0172083 | A1 | * | 8/2006 | Lee et al. ............ 427/535 |
| 2006/0180811 | A1 | * | 8/2006 | Lee et al. ............ 257/40 |
| 2008/0316804 | A1 | | 12/2008 | Jeong et al. |
| 2009/0298222 | A1 | * | 12/2009 | Lowrey et al. ............ 438/102 |

FOREIGN PATENT DOCUMENTS

| JP | 2006-182781 A | 7/2006 |
| KR | 10-2007-0118865 A | 12/2007 |

OTHER PUBLICATIONS

Ielmini et al "Recovery and Drift Dynamics of Resistance and Threshold Voltages in Phase-Change Memories" *IEEE Transactions on Electron Devices* 54(2):308-315 (2007).

Kastner et al. "Valence-Alternation Model for Localized Gap States in Lone-Pair Semiconductors" *Physical Review Letters* 37(22):1504-1507 (1976).

Street et al. "States in the Gap in Glassy Semiconductors" *Physical Review Letters* 35(19):1293-1296 (1975).

* cited by examiner

*Primary Examiner* — Luan C Thai
(74) *Attorney, Agent, or Firm* — Myers Bigel Sibley & Sajovec, P.A.

(57) ABSTRACT

Phase change memory devices may be fabricated by forming a first electrode on a substrate and forming a chalcogenide material on the first electrode. The chalcogenide material is plasma treated sufficiently to induce a plasma species throughout the chalcogenide material. A second electrode is formed on the chalcogenide material. Related devices are also described.

13 Claims, 8 Drawing Sheets

PLASMA TREATING METHODS OF FABRICATING PHASE CHANGE MEMORY DEVICES, AND MEMORY DEVICES SO FABRICATED

CROSS-REFERENCE TO RELATED APPLICATION

This application claims priority under 35 USC §119 to Korean Patent Application No. 10-2008-0085402, filed on Aug. 29, 2008, the disclosure of which is hereby incorporated herein by reference in its entirety as if set forth fully herein.

BACKGROUND OF THE INVENTION

This invention relates to methods of fabricating nonvolatile memory devices and devices so fabricated, and more specifically to methods of fabricating phase change memory devices and devices so fabricated.

Phase change memory devices are widely used as nonvolatile memory devices in many consumer, commercial and other applications. Phase change memory devices are also referred to as Phase-change Random Access Memory (PRAM) devices. As is well known to those having skill in the art, a PRAM cell may comprise a phase change material, such as a chalcogenide material, between first and second electrodes. When heated and cooled under appropriate conditions, the phase change material, such as the chalcogenide material, adopts one of two stable but programmable phases: crystalline or amorphous. The resistance of the crystalline phase is relatively low, whereas the resistance of the amorphous phase is relatively high. The program state of the cell may therefore be determined by measuring its resistance. PRAM devices have been designed to store one bit per cell (single level) or multiple bits per cell (multilevel). The design, fabrication and operation of PRAM devices as described in this paragraph is well known to those having skill in the art, and need not be described further herein.

As noted above, the operation of a PRAM cell depends upon the phase change material adopting a stable programmable phase, so as to exhibit a given resistance. Unfortunately, however, it has been found that the resistance may drift over time, as noted, for example, in Street et al., "States in the Gap in Glassy Semiconductors", *Physical Review Letters*, 35(19):1293-1296 (1975); Kastner et al., "Valence-Alternation Model for Localized Gap States in Lone-Pair Semiconductors" *Physical Review Letters*, 37(22):1504-1507 (1976); and Ielmini et al., "Recovery and Drift Dynamics of Resistance and Threshold Voltages in Phase-Change Memories" 54(2):308-315 (2007). This drift in resistance over time can adversely impact the reliability and/or operability of the phase change memory device.

SUMMARY OF THE INVENTION

Phase change memory devices may be fabricated, according to various embodiments, by forming a first electrode on a substrate and forming a chalcogenide material on the first electrode. The chalcogenide material is plasma treated sufficiently to induce a plasma species throughout the chalcogenide material. A second electrode is formed on the chalcogenide material.

The plasma treatment may be performed at one or more times during the fabrication of the phase change memory device. In some embodiments, an insulating layer is formed on the first electrode including a hole therein, and the chalcogenide material is formed in the hole and on the insulating layer outside the hole. The chalcogenide material in the hole and on the insulating layer outside the hole is plasma treated. In other embodiments, the chalcogenide material is removed from outside the hole and the chalcogenide material in the hole is plasma treated after removing the chalcogenide material outside the hole but before forming the second electrode on the chalcogenide material. In still other embodiments, the second electrode is formed on the chalcogenide material, so as to expose a sidewall of the chalcogenide material, and the plasma treating is performed after forming the second electrode on the chalcogenide material, through the exposed sidewall.

Various plasmas may be used according to various embodiments. In some embodiments, hydrogen plasma treating the chalcogenide material is performed sufficiently to introduce hydrogen throughout the chalcogenide material. In other embodiments, halogen plasma treating the chalcogenide material is performed sufficiently to introduce halogen throughout the chalcogenide material.

Various ranges of processing parameters also may be used according to various embodiments. In some embodiments, plasma treating the chalcogenide material is performed at plasma power of less than about 100 W. In other embodiments, plasma treating of chalcogenide material is performed at temperature of less than about 350° C. In still other embodiments, the plasma treating is performed at plasma power of between about 25 W and about 50 W, and at temperature of between 200° C. and about 350° C.

Moreover, as noted above, plasma treating the chalcogenide material is performed sufficiently to introduce a plasma species throughout the chalcogenide material. In some embodiments, plasma treating is performed sufficiently to introduce at least about 5 at. % of a plasma species throughout the chalcogenide material. In other embodiments, between about 10 at. % and about 20 at. % of the plasma species is introduced throughout the material. In still other embodiments, plasma treating is performed sufficiently to introduce a given at. % of a plasma species at an edge or surface of the chalcogenide material, and at least one-sixth (⅙) of the given at. % of the plasma species at a center (i.e., remote from the edge or surface) of the chalcogenide material. Still other embodiments, plasma treating is performed sufficiently to produce less than about six times variation of at. % of a plasma species in the chalcogenide material.

Phase change memory devices according to various embodiments include a substrate, a first electrode on the substrate and a chalcogenide material on the first electrode. The chalcogenide material includes hydrogen and/or halogen throughout. A second electrode is provided on the chalcogenide material.

In some embodiments, the chalcogenide material has at least about 5 at. % hydrogen and/or halogen throughout. In other embodiments, the chalcogenide material has been about 10 at. % and about 20 at. % of hydrogen and/or halogen throughout. In still other embodiments, the chalcogenide material has a given at. % of hydrogen and/or halogen at an edge or surface thereof, and at least one-sixth (⅙) of the given at. % of hydrogen and/or halogen at a center thereof. In yet other embodiments, the chalcogenide material has less than about six times variation of at. % of hydrogen and/or halogen in the chalcogenide material.

Phase change memory devices according to various embodiments may be combined with a controller, an input/output device and/or a wireless interface to provide an electronic device. The electronic device may include a personal digital assistant, a laptop computer, a tablet computer, a mobile phone and/or a digital music player.

DETAILED DESCRIPTION

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions may be exaggerated for clarity. Like numbers refer to like elements throughout. As used herein the term "and/or" includes any and all combinations of one or more of the associated listed items and may be abbreviated as "/".

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "having," "having," "includes," "including" and/or variations thereof, when used in this specification, specify the presence of stated features, regions, steps, operations, elements, and/or components, but do not preclude the presence or addition of one or more other features, regions, steps, operations, elements, components, and/or groups thereof.

It will be understood that when an element such as a layer or region is referred to as being "on" or extending "onto" another element (or variations thereof), it can be directly on or extend directly onto the other element or intervening elements may also be present. In contrast, when an element is referred to as being "directly on" or extending "directly onto" another element (or variations thereof), there are no intervening elements present. It will also be understood that when an element is referred to as being "connected" or "coupled" to another element (or variations thereof), it can be directly connected or coupled to the other element or intervening elements may be present. In contrast, when an element is referred to as being "directly connected" or "directly coupled" to another element (or variations thereof), there are no intervening elements present.

It will be understood that, although the terms first, second, etc. may be used herein to describe various elements, components, regions, layers and/or sections, these elements, materials, regions, layers and/or sections should not be limited by these terms. These terms are only used to distinguish one element, material, region, layer or section from another element, material, region, layer or section. Thus, a first element, material, region, layer or section discussed below could be termed a second element, material, region, layer or section without departing from the teachings of the present invention.

Relative terms, such as "lower", "back", and "upper" may be used herein to describe one element's relationship to another element as illustrated in the Figures. It will be understood that relative terms are intended to encompass different orientations of the device in addition to the orientation depicted in the Figures. For example, if the structure in the Figure is turned over, elements described as being on the "backside" of substrate would then be oriented on "upper" surface of the substrate. The exemplary term "upper", can therefore, encompasses both an orientation of "lower" and "upper," depending on the particular orientation of the figure. Similarly, if the structure in one of the figures is turned over, elements described as "below" or "beneath" other elements would then be oriented "above" the other elements. The exemplary terms "below" or "beneath" can, therefore, encompass both an orientation of above and below.

Embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated, typically, may be rounded. Thus, the regions illustrated in the figures are schematic in nature and their shapes are not intended to illustrate the precise shape of a region and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Some embodiments of the present invention may arise from recognition that it is desirable to introduce a species or dopant throughout the chalcogenide material, to thereby reduce or eliminate dangling bonds and/or other defects throughout the material that can create trap sites throughout the material, and adversely increase the resistance drift of the material. Unfortunately, if an anneal is used to dope a species throughout the material, the anneal may need to take place at a sufficiently high temperature so as to volatize the chalcogenide material. In sharp contrast, a plasma may be used to introduce a plasma species throughout the chalcogenide material at a sufficiently low plasma power so as to not unduly damage the chalcogenide material, and at a sufficiently low temperature so as to not unduly volatize the chalcogenide material, but at a sufficiently high kinetic energy so as to cause the plasma species to penetrate throughout the material. Accordingly, various embodiments of the present invention may acceptably reduce the resistance drift of the chalcogenide material without itself introducing additional problems.

A hydrogen anneal of a chalcogenide material, so as to reduce the resistance drift thereof, is described in application Ser. No. 12/079,886, filed Mar. 28, 2008, entitled "Multiple Level Cell Phase-Change Memory Devices Having Controlled Resistance-Drift Parameter, Memory Systems Employing Such Devices and Methods of Reading Memory Devices", assigned to the assignee of the present application, the disclosure of which is hereby incorporated herein by reference in its entirety as if set forth fully herein.

Figure 1A:
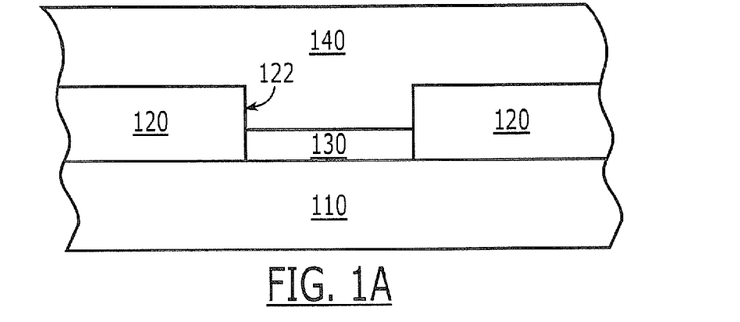
FIGS. 1A-1C are cross-sectional views of methods of fabricating phase change memory devices and memory devices so fabricated, according to various embodiments.
Figure 1B:
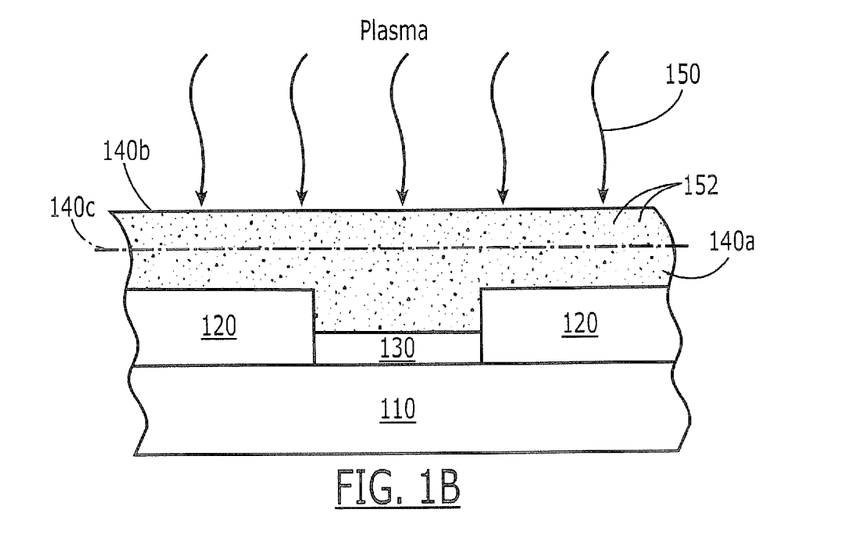
Figure 1C:
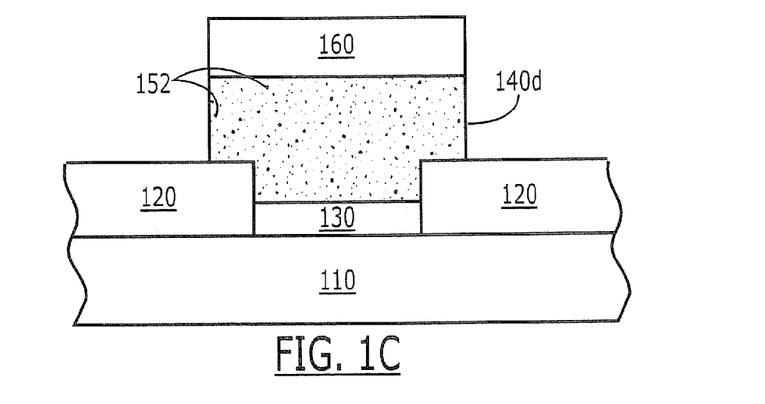

FIGS. 1A-1C are cross-sectional views of methods of fabricating phase change memory devices and devices so fabricated according to various embodiments. Referring to FIG. 1A, a phase change memory device is fabricated by forming a first electrode 130 on a substrate 110. The substrate 110 may include a single element and/or compound semiconductor substrate and/or any other single layer or multilayer microelectronic substrate. Various switching devices (e.g., transistor or diode structures) may be provided in the substrate 110. An insulating layer 120, such as a silicon dioxide layer, is provided on the substrate, and a first electrode 130, also referred to as a bottom electrode, is formed in a hole 122 in the insulating layer 120. The bottom electrode 130 may comprise a high resistivity material, such as titanium nitride and the like, that can operate as a resistive heater to generate a current. Multilayer first electrodes 130 also may be provided. Moreover, the first electrode 130 need not be formed in a hole 122 in an insulating layer 120. A layer of chalcogenide material 140 is then formed on the first electrode 130, for example in the hole 122 and extending on the insulating layer 120 outside the hole. The chalcogenide material may include an alloy of germanium (Ge), antimony (Sb), and tellurium (Te), which is referred to commonly as a GST alloy. However, other chalcogenide materials may be used. The fabrication of the structure of FIG. 1A, as described in this paragraph, is known to those having skill in the art, and need not be described further herein.

Referring now to FIG. 1B, the chalcogenide material 140 is plasma treated using a plasma 150 sufficiently to introduce a plasma species 152 throughout the chalcogenide material 140, to thereby produce plasma treated chalcogenide material 140a. In some embodiments, the plasma 150 is a hydrogen plasma, and the plasma species 152 is a hydrogen-based species. In other embodiments, the plasma 150 is a halogen plasma, and the plasma species 152 is a halogen-based species.

As noted above, plasma treating is performed sufficiently to introduce plasma species 152 throughout the chalcogenide material 140a. By utilizing a plasma 150, sufficient kinetic energy may be imparted to the species 152, to introduce the species 152 throughout the chalcogenide material 140a. However, the kinetic energy may be sufficiently low so that the chalcogenide material 140a is not itself damaged. Moreover, the temperature can be sufficiently low so that the excessive amounts of the chalcogenide material 140a is not volatized. Accordingly, resistance drift may be reduced dramatically, without the need to adversely impact other parameters of the chalcogenide material.

More specifically, in some embodiments, the chalcogenide material 140a is plasma treated at a plasma power of less than about 100 W, so as to allow the hydrogen and/or halogen species to be introduced throughout the chalcogenide material 140a without excessively damaging the chalcogenide material 140a. In other embodiments, the chalcogenide material 140a is plasma treated at less than about 350° C., so as not to volatize the chalcogenide material 140a. In still other embodiments, plasma treating the chalcogenide material 140a is performed at plasma power of between about 25 W and about 50 W, and at temperature between about 200° C. and about 350° C.

Moreover, the plasma treating may be performed sufficiently so as to introduce at least about 5 at. % of the plasma species 152 throughout the chalcogenide material 140a. In other embodiments, between about 10 at. % and about 20 at. % of the plasma species 152 may be introduced throughout the chalcogenide material 140a. Moreover, the use of the plasma may allow relatively uniform introduction of the plasma species throughout the material. For example, in some embodiments, less than about six times variation of at. % of the plasma species may be produced in the chalcogenide material. In other embodiments, a given at. % of a plasma species 152 is produced at an edge, for example an exposed top surface 140b of the chalcogenide material 140a, and at least one-sixth of the at. % of the plasma species 152 is provided at a center, such as along center line 140c of the chalcogenide material, that is remote from the edge. Contrast these embodiments with a hydrogen anneal of the chalcogenide material 140. In a hydrogen anneal, diffusion limitations may prevent introduction of the hydrogen throughout the chalcogenide material, unless the temperature is raised sufficiently so as to volatize the chalcogenide material.

Referring now to FIG. 1C, the plasma treated chalcogenide material 140a may be patterned to provide a patterned, plasma treated material 140d, and a second or top electrode 160 may be formed on the chalcogenide material 140d. In other embodiments, the top electrode 160 is blanket deposited, and then the top electrode 160 and the plasma treated chalcogenide layer 140a are patterned together to form the structure of FIG. 1C.

Figure 2A:
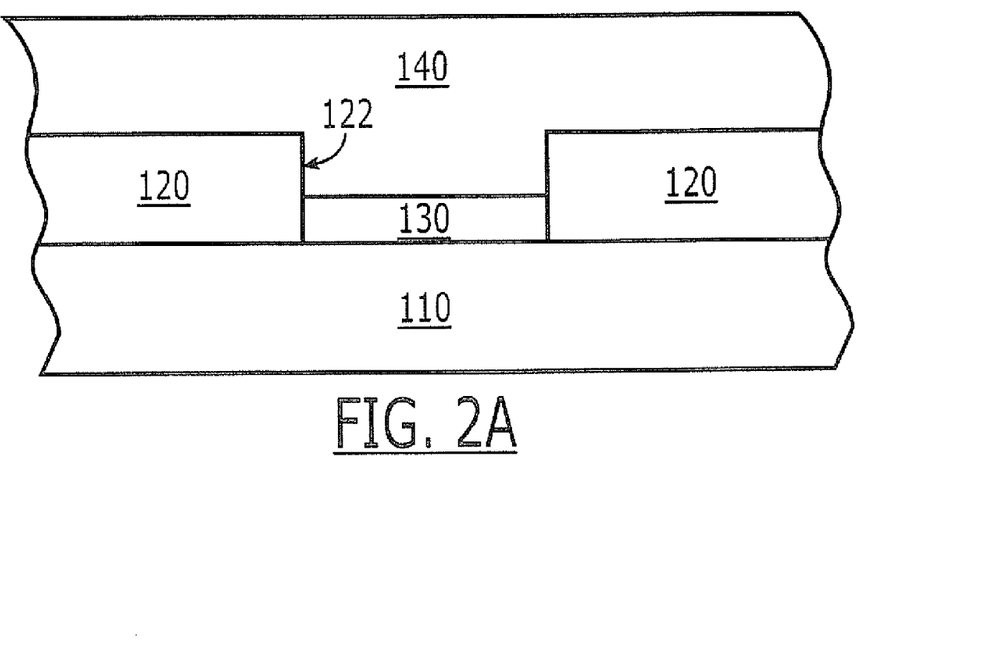
FIGS. 2A-2D are cross-sectional views of methods of fabricating phase change memory devices and memory devices so fabricated, according to other embodiments.
Figure 2B:
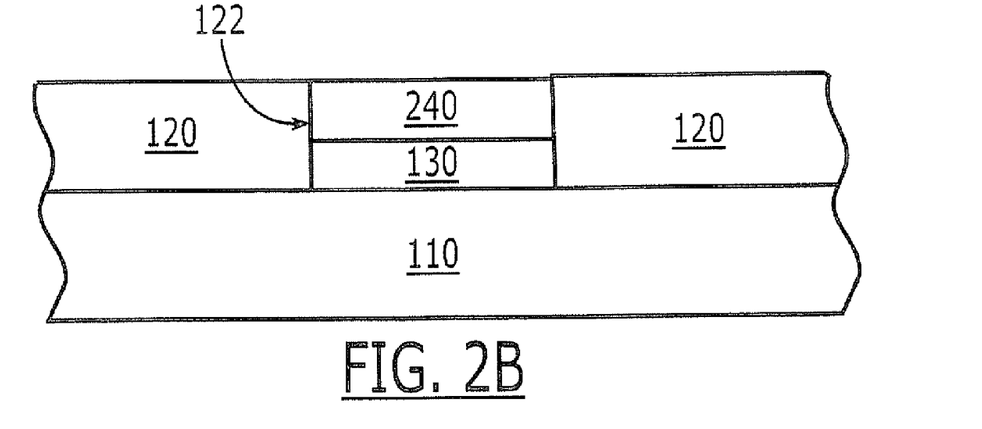
Figure 2C:
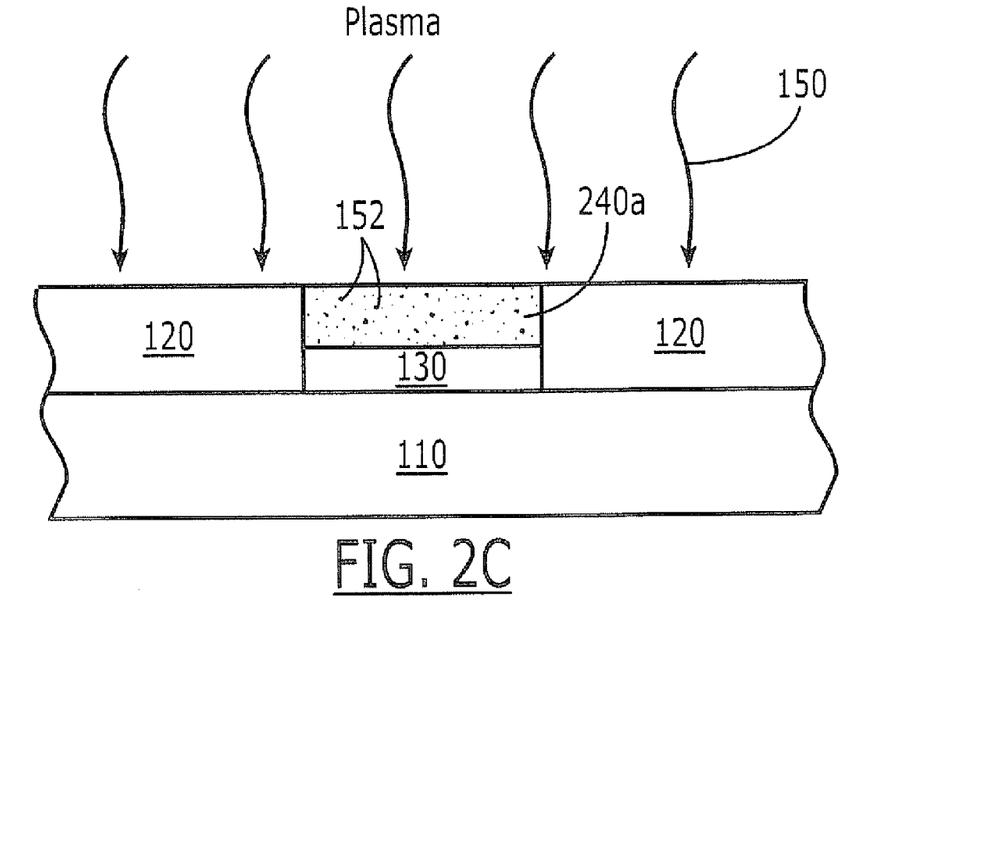
Figure 2D:
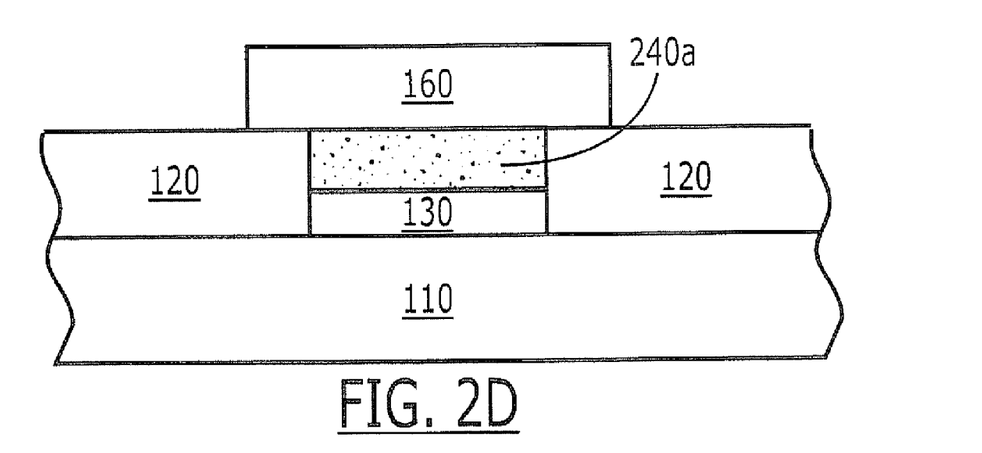

FIGS. 2A-2D illustrate methods of fabricating phase change memory devices according to other embodiments, and devices so fabricated. In particular, FIG. 2A corresponds to FIG. 1A, and will not be described again. Then, as shown in FIG. 2B, the chalcogenide material 140 may be planarized within the hole 122 using conventional etch-back and/or chemical-mechanical polishing techniques, to form a planarized chalcogenide material 240. Referring to FIG. 2C, plasma treating the planarized chalcogenide material 240 is performed using a plasma 150 sufficiently to introduce plasma species 152 throughout the plasma treated chalcogenide material 240a. Parameters of the plasma processing and the species distribution may be provided as was described in connection with FIG. 1B above. Finally, referring to FIG. 2D, a top or second electrode 160 is formed on the plasma treated chalcogenide material 240a. The top electrode 160 may be congruent to the plasma treated chalcogenide material 240a in the hole or may be larger or smaller in area. The top electrode 160 may also extend into the hole 122 in some embodiments.

Figure 3A:
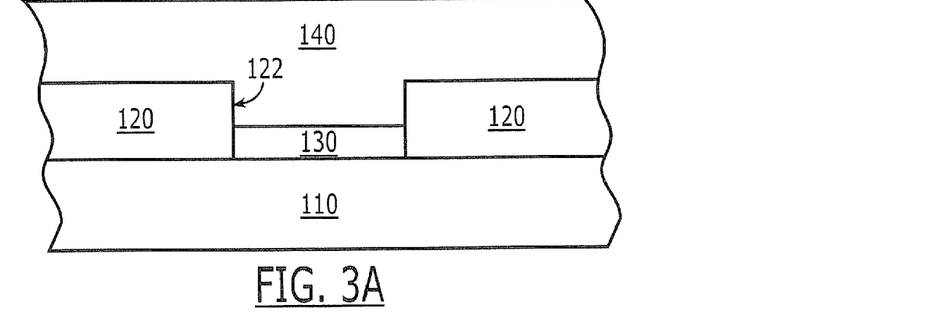
FIGS. 3A-3C are cross-sectional views of methods of fabricating phase change memory devices and memory devices so fabricated, according to still other embodiments.
Figure 3B:
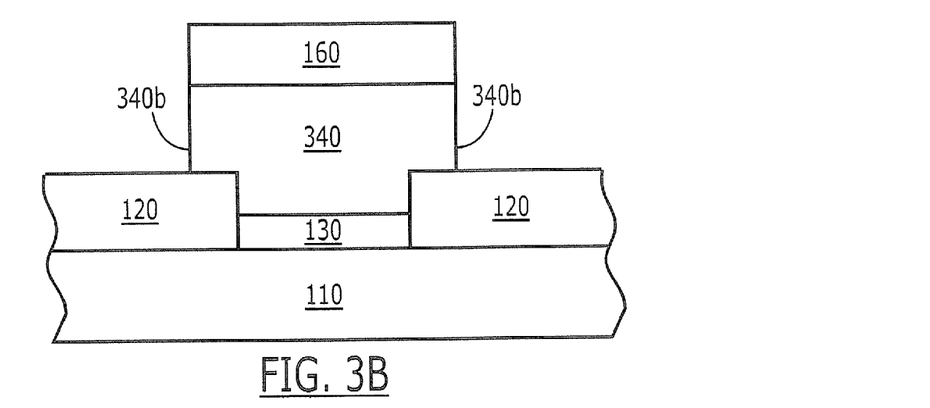

FIGS. 3A-3C are cross-sectional views of methods of fabricating phase change memory devices according to various other embodiments, and phase change memory devices so fabricated. FIG. 3A corresponds to FIG. 1A, and the description thereof will not be repeated. Then, as shown in FIG. 3B, a top or second electrode may be formed and the top electrode and chalcogenide layer 140 may be patterned to form a patterned top electrode 160 and patterned chalcogenide material

340. Note that in FIG. 3B, a sidewall 340*b* of the patterned chalcogenide material 340 is exposed. Then, referring to FIG. 3C, plasma treatment is performed using plasma 152 to introduce a plasma species 152 throughout the patterned chalcogenide material 340, and thereby produce a plasma treated chalcogenide material 340*a*. Parameters of the plasma treatment and the distribution of the plasma species 152 may be provided as was described above.

Figure 3C:
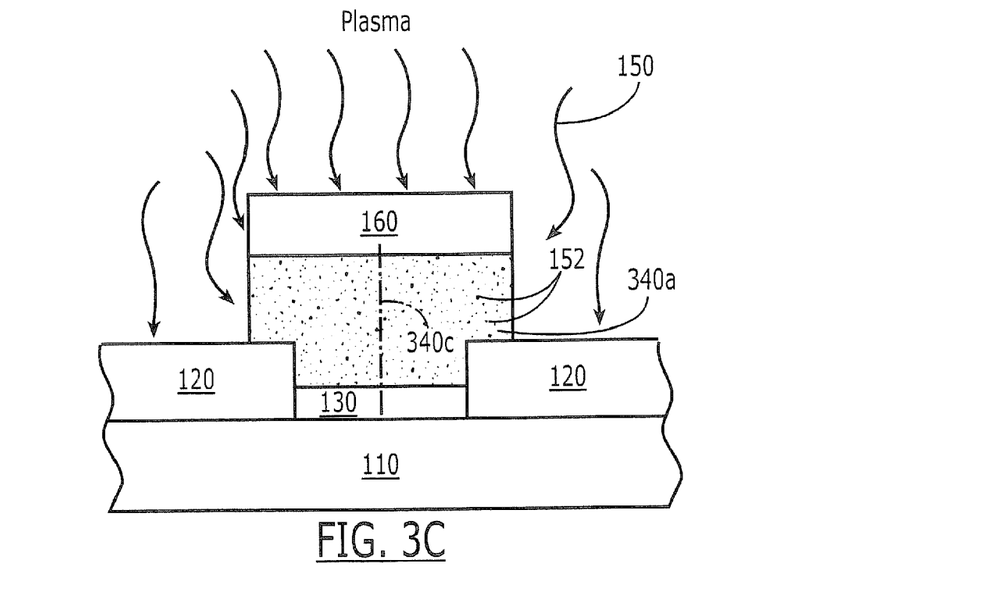

Note that in FIG. 3C, the plasma 150 is introduced into the patterned chalcogenide material 340 through the exposed sidewalls 340*b* thereof. Yet, the plasma 150 has sufficient energy so as to introduce the plasma species 150 throughout the plasma treated chalcogenide material 340*a*, so as to introduce at least about 5 at. % of the plasma species 152 throughout the plasma treated chalcogenide material 340*a* so as to introduce between about 10 at. % and about 20 at. % of the plasma species 152 throughout the plasma treated chalcogenide material 340*a* so as to produce less than six times variation of at. % of the plasma species 152 in the patterned chalcogenide material 340*a*, and/or so as to introduce a given at. % of plasma species at an edge (sidewall) 340*b* of the chalcogenide material and at least one-sixth of a given at. % of the plasma species at a center 340*c* of the chalcogenide material. In sharp contrast, in a hydrogen anneal, little if any hydrogen would penetrate within the patterned chalcogenide layer 340 of FIG. 3B, especially adjacent the center 340*c* thereof, remote from the exposed sidewalls 340*b*.

Accordingly, embodiments of the invention that have been described above in connection with FIG. 1A-3C use a hydrogen plasma and/or a halogen plasma to plasma treat a chalcogenide material. The hydrogen plasma may include hydrogen itself, deuterium (D2) and/or tritium (H3). The halogen plasma may include any of the non-metal elements from Group VII and Group VIIA of the periodic table, including fluorine (F), chlorine (Cl), bromine (Br), iodine (I) and/or astatine (At), including diatomic and other forms thereof.

Figure 4A:
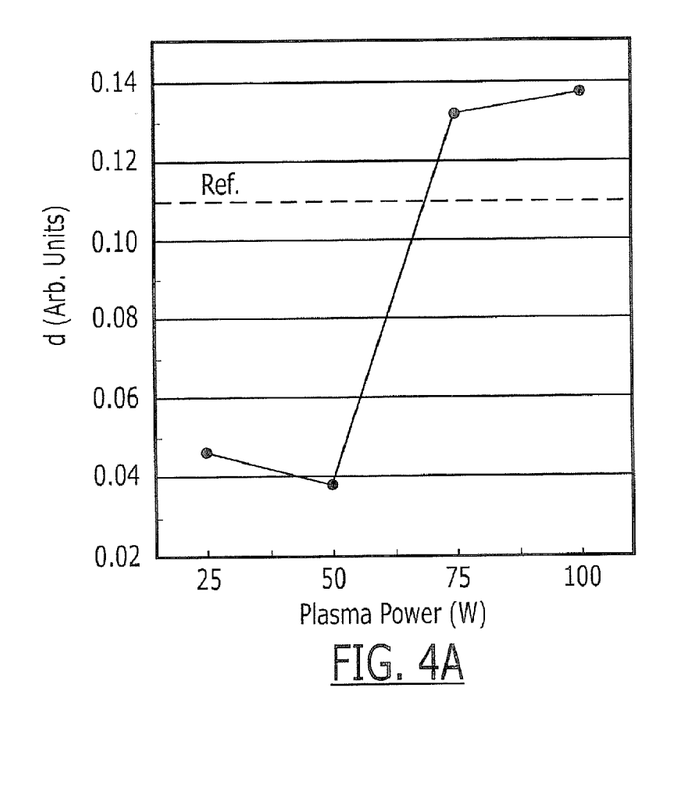
FIGS. 4A-4B graphically illustrate a resistance drift coefficient as a function of plasma power and process temperature, respectively, according to various embodiments.
Figure 4B:
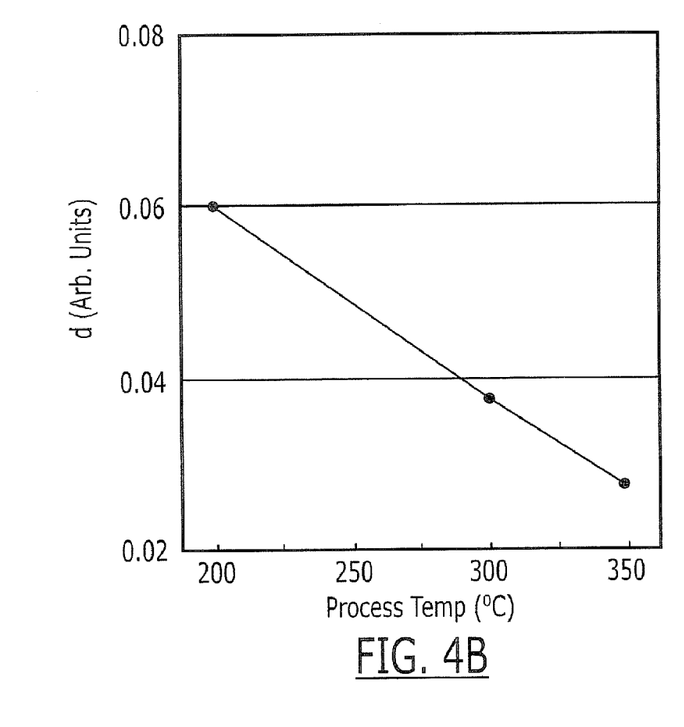

FIGS. 4A and 4B graphically illustrate a resistance drift coefficient "d" as a function of plasma power (FIG. 4A) and process temperature (FIG. 4B) according to various embodiments. FIG. 4A illustrates that plasma powers of between about 25 W and about 50 W can provide a much lower value of d than an untreated chalcogenide layer (indicated in FIG. 4A as "Ref"). FIG. 4B illustrates that acceptable reductions in d can be obtained at relatively low process temperatures between about 200° C. and about 350° C.

Figure 5A:
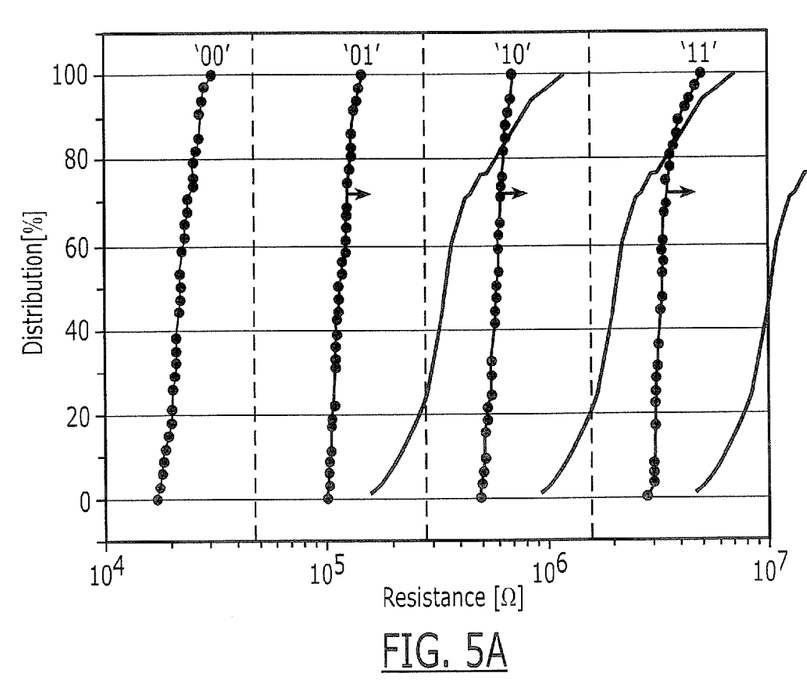
FIGS. 5A-5B graphically illustrate a change in resistance distribution in a multilevel phase change memory device where the resistance drift is not controlled, and where the resistance drift of the material is controlled, in accordance with various embodiments, respectively.
Figure 5B:
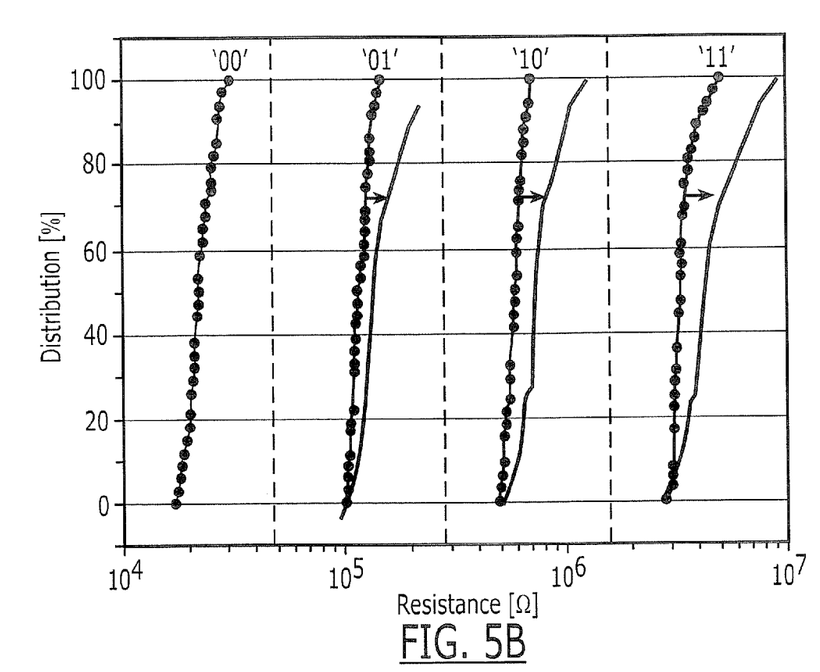

FIGS. 5A and 5B graphically illustrate a change in resistance distribution in a multilevel phase change memory device, where the resistance drift is not controlled (FIG. 5A) and where the resistance drift of the material is controlled in accordance with various embodiments of the present invention (FIG. 5B). Again, as shown, a large reduction in resistance drift is shown in FIG. 5B compared to FIG. 5A.

Figure 6A:
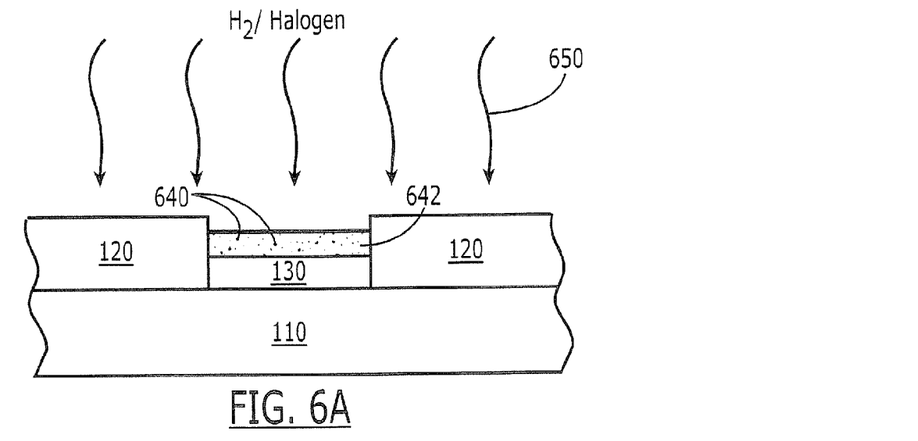
FIGS. 6A-6C are cross-sectional views of methods of fabricating phase change memory devices and memory devices so fabricated, according to yet other embodiments.
Figure 6B:
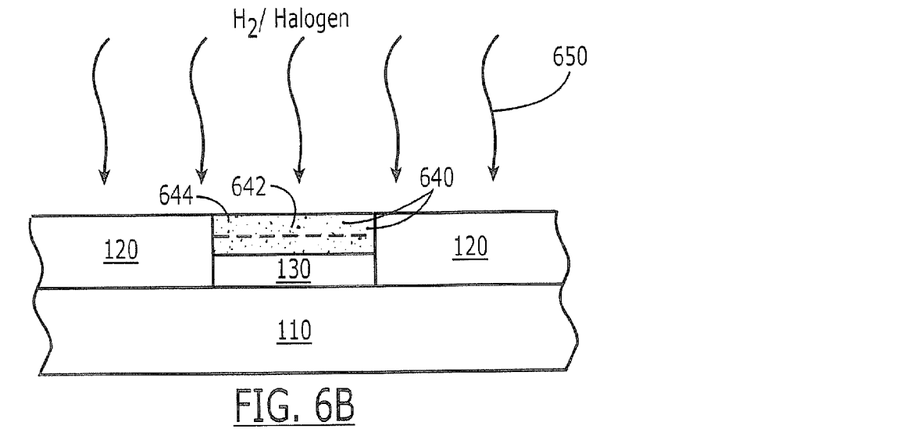
Figure 6C:
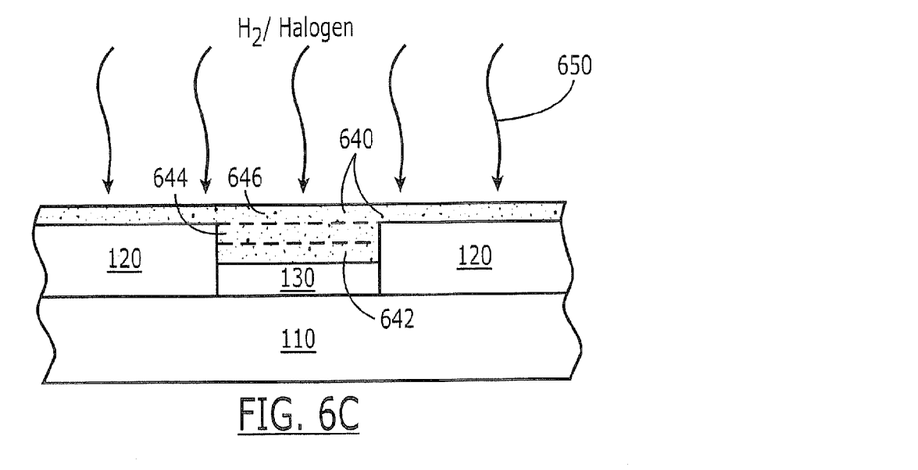

FIGS. 6A-6C are cross-sectional views of methods of fabricating a phase change memory device according to still other embodiments, and devices so formed. FIGS. 6A-6C illustrate in situ introduction of a species throughout the chalcogenide material using an anneal or a plasma of hydrogen and/or halogen. More particularly, FIGS. 6A-6C illustrate sequential buildup of a layer of chalcogenide material beginning with a thin layer 642 (FIG. 6A), proceeding to a thicker layer 644 (FIG. 6B) and ending with an even thicker layer 646 (FIG. 6C). During this growth process, as illustrated in FIGS. 6A-6C, a species 640 (hydrogen and/or halogen) is continuously introduced throughout the chalcogenide material as it is grown by exposure to a thermal anneal and/or plasma of hydrogen and/or halogen. Thus, in FIGS. 6A-6C, the arrows 650 indicate plasma treatment in a halogen atmosphere, plasma treatment in a hydrogen atmosphere, heat treatment (anneal) in a halogen atmosphere, or heat treatment (anneal) in a hydrogen atmosphere, in situ, during formation of the chalcogenide layer 642, 644, 646, using chemical vapor deposition, atomic vapor deposition, plasma and/or other similar processes. Note that FIGS. 6A-6C only illustrate three representative times during in situ growth of the chalcogenide material in the interest of brevity. It will also be understood that any of the embodiments of FIGS. 1A-1C, 2A-2D or 3A-3C may be used to form the chalcogenide material and the top electrode.

Figure 7A:
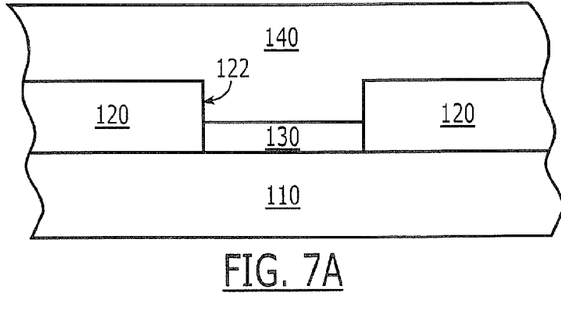
FIGS. 7A-7B are cross-sectional views of methods of fabricating phase change memory devices and memory devices so fabricated, according to still other embodiments.
Figure 7B:
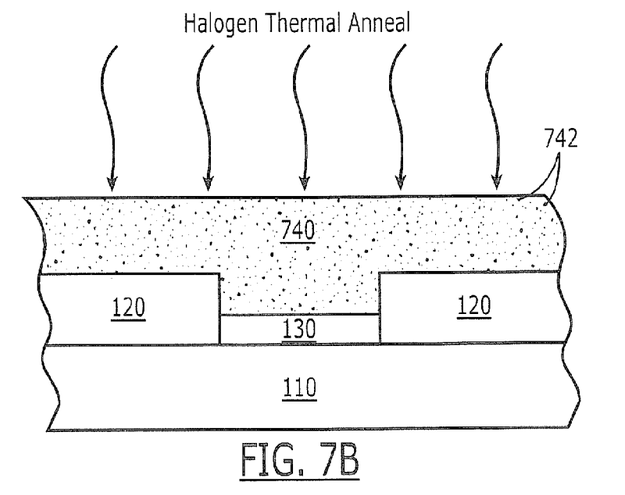

FIGS. 7A and 7B are cross-sectional views of methods of fabricating phase change memory devices according to other embodiments, and devices so fabricated. FIG. 7A corresponds to FIG. 1A and will not be described again. FIG. 7B illustrates performing a halogen thermal anneal, so as to introduce halogen 742 into the chalcogenide layer 740. The halogen 742 may be introduced throughout the layer 740 or may only be introduced in a portion of the layer 740. It will also be understood that any of the embodiments of FIGS. 1A-1C, 2A-2D or 3A-3C may be used to form the chalcogenide material and the top electrode.

Figure 8:
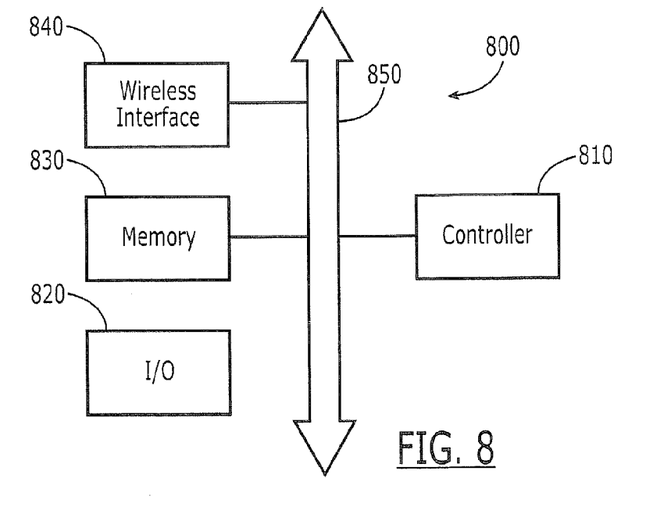
FIG. 8 is a block diagram of a portable electronic device that can include a phase change memory device, according to various embodiments.

FIG. 8 is a block diagram of a memory device 830 according to any of the embodiments described herein that is combined with a controller 810, an input/output device 820 and/or a wireless interface 840 that are interconnected by a bus 850, to provide an electronic device 800. The electronic device 800 may comprises a personal digital assistant (PDA), a laptop computer, a tablet computer, a mobile phone, a digital music player and/or other electronic device that may be configured to transmit and receive information in a wireless environment.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A method of fabricating a phase change memory device comprising:
   forming a first electrode on a substrate;
   forming a chalcogenide material on the first electrode; then
   plasma treating the chalcogenide material that was formed on the first electrode sufficiently to introduce a plasma species throughout the chalcogenide material that was formed on the first electrode; and
   forming a second electrode on the chalcogenide material.

2. A method according to claim 1:
   wherein forming a chalcogenide material on the first electrode comprises forming an insulating layer on the first electrode including a hole therein and forming the chalcogenide material in the hole and on the insulating layer outside the hole; and
   wherein plasma treating the chalcogenide material comprises plasma treating the chalcogenide material in the hole and on the insulating layer outside the hole.

3. A method according to claim 1:
wherein forming a chalcogenide material on the first electrode comprises forming an insulating layer on the first electrode including a hole therein, forming the chalcogenide material in the hole and on the insulating layer outside the hole and removing the chalcogenide material outside the hole; and
wherein plasma treating the chalcogenide material comprises plasma treating the chalcogenide material in the hole after removing the chalcogenide material outside the hole but before forming the second electrode on the chalcogenide material.

4. A method according to claim 1 wherein forming a second electrode on the chalcogenide material is performed so as to expose a sidewall of the chalcogenide material and wherein plasma treating the chalcogenide material is performed after forming the second electrode on the chalcogenide material, through the exposed sidewall.

5. A method according to claim 1 wherein plasma treating the chalcogenide material comprises hydrogen plasma treating the chalcogenide material that was formed on the first electrode sufficiently to introduce hydrogen throughout the chalcogenide material that was formed on the first electrode.

6. A method according to claim 1 wherein plasma treating the chalcogenide material comprises halogen plasma treating the chalcogenide material that was formed on the first electrode sufficiently to introduce halogen throughout the chalcogenide material that was formed on the first electrode.

7. A method according to claim 1 wherein plasma treating the chalcogenide material is performed at plasma power of less than about 100 W.

8. A method according to claim 1 wherein plasma treating the chalcogenide material is performed at temperature less than about 350° C.

9. A method according to claim 1 wherein plasma treating the chalcogenide material is performed at plasma power of between about 25 W and about 50 W and at temperature between about 200° C. and about 350° C.

10. A method according to claim 1 wherein plasma treating the chalcogenide material is performed sufficiently to introduce at least about 5 at. % of a plasma species throughout the chalcogenide material.

11. A method according to claim 1 wherein plasma treating the chalcogenide material is performed sufficiently to introduce between about 10 at. % and about 20 at. % of a plasma species throughout the chalcogenide material.

12. A method according to claim 1 wherein plasma treating the chalcogenide material is performed sufficiently to introduce a given at. % of a plasma species at an edge of the chalcogenide material and at least ⅙ of the given at. % of the plasma species at a center of the chalcogenide material.

13. A method according to claim 1 wherein plasma treating the chalcogenide material is performed sufficiently to produce less than about 6 times variation of at. % of a plasma species in the chalcogenide material.

* * * * *